(12) United States Patent
Yahata et al.

(10) Patent No.: US 8,653,502 B2
(45) Date of Patent: Feb. 18, 2014

(54) GROUP III NITRIDE SEMICONDUCTOR LIGHT-EMITTING DEVICE

(75) Inventors: Kosuke Yahata, Kiyosu (JP); Naoki Nakajo, Kiyosu (JP); Koichi Goshonoo, Kiyosu (JP); Yuya Ishiguro, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/433,195

(22) Filed: Mar. 28, 2012

(65) Prior Publication Data
US 2012/0248406 A1   Oct. 4, 2012

(30) Foreign Application Priority Data

Mar. 30, 2011   (JP) .................................. 2011-074761
Sep. 28, 2011   (JP) .................................. 2011-213235

(51) Int. Cl.
*H01L 29/06*   (2006.01)
*H01L 31/00*   (2006.01)

(52) U.S. Cl.
USPC ........... 257/13; 257/76; 257/98; 257/E51.021

(58) Field of Classification Search
USPC .......................................................... 257/98
See application file for complete search history.

(56) References Cited

U.S. PATENT DOCUMENTS

| | | | |
|---|---|---|---|
| 2003/0057444 A1 | 3/2003 | Niki et al. | |
| 2005/0001227 A1 | 1/2005 | Niki et al. | |
| 2008/0121903 A1* | 5/2008 | Hiramatsu et al. | 257/89 |
| 2008/0303043 A1 | 12/2008 | Niki et al. | |
| 2009/0042328 A1 | 2/2009 | Niki et al. | |
| 2010/0140636 A1* | 6/2010 | Donofrio et al. | 257/98 |
| 2010/0163901 A1* | 7/2010 | Fudeta | 257/98 |
| 2010/0181592 A1* | 7/2010 | Yamazaki et al. | 257/98 |
| 2010/0200881 A1* | 8/2010 | Masaki | 257/98 |
| 2010/0244079 A1* | 9/2010 | Orita | 257/98 |
| 2010/0264445 A1 | 10/2010 | Niki et al. | |
| 2010/0264446 A1 | 10/2010 | Niki et al. | |
| 2010/0264447 A1 | 10/2010 | Niki et al. | |
| 2010/0266815 A1 | 10/2010 | Niki et al. | |
| 2010/0267181 A1 | 10/2010 | Niki et al. | |
| 2012/0009768 A1 | 1/2012 | Tadatomo et al. | |
| 2012/0153323 A1* | 6/2012 | Hawryluk et al. | 257/98 |

FOREIGN PATENT DOCUMENTS

| | | |
|---|---|---|
| JP | 2003-318441 A | 11/2003 |
| JP | 2010-171382 A | 8/2010 |
| JP | 2010-225787 A | 10/2010 |

* cited by examiner

*Primary Examiner* — Matthew W Such
*Assistant Examiner* — Samuel Lair
(74) *Attorney, Agent, or Firm* — McGinn Intellectual Property Law Group, PLLC

(57) ABSTRACT

The present invention provides a Group III nitride semiconductor light-emitting device exhibiting high-intensity light output in a specific direction and improved light extraction performance. The Group III nitride semiconductor light-emitting device comprises a sapphire substrate, and a layered structure having a light-emitting layer provided on the sapphire substrate and formed of a Group III nitride semiconductor. On the surface on the layered structure side of the sapphire substrate, a two-dimensional periodic structure of mesas is formed with a period which generates a light intensity interference pattern for the light emitted from the light-emitting layer. The light reflected by or transmitted through the two-dimensional periodic structure has an interference pattern. Therefore, the light focused on a region where the light intensity is high in the interference pattern can be effectively output to the outside, resulting in the improvement of light extraction performance as well as the achievement of desired directional characteristics.

12 Claims, 15 Drawing Sheets t=1.0μm  b=2.8μm  h=1.5μm
Angle 59° t=1.0 μm  b=2.8 μm  h=1.5 μm
Angle 59° t=2.44 μm   b=2.73 μm   h=0.87 μm
Angle 81° t=1.24μm   b=2.16μm   h=1.14μm
Angle 70° t=0.98 μm   b=1.89 μm   h=1.22 μm
Angle 69°

Light

Light

GROUP III NITRIDE SEMICONDUCTOR LIGHT-EMITTING DEVICE

BACKGROUND OF THE INVENTION

1. Field of the Invention

The present invention relates to a Group III nitride semiconductor light-emitting device whose light extraction performance is improved by forming irregularities on a sapphire substrate included in the device.

2. Background Art

In recent years, Group III nitride semiconductor light-emitting devices have begun to be used in general illumination applications, and have been strongly required to exhibit improved light extraction performance. Japanese Patent Application Laid-Open (kokai) No. 2003-318441 discloses a method for improving the light extraction performance of a semiconductor light-emitting device, in which irregularities are formed on a sapphire substrate. In the case of a semiconductor light-emitting device including a flat sapphire substrate having no irregularities, light propagated in the device in a direction horizontal to the substrate is confined in semiconductor layers and is attenuated through, for example, repeated multiple reflection. In contrast, in the case of a semiconductor light-emitting device including a sapphire substrate having irregularities, light propagated in the device in a direction horizontal to the substrate can be reflected or scattered in a direction perpendicular to the substrate and can be extracted to the outside, whereby light extraction performance can be improved. Such irregularities may have, for example, a stripe pattern or a dot pattern as viewed from above.

Meanwhile, Japanese Patent Application Laid-Open (kokai) No. 2010-171382 discloses that irregularities are formed on a transparent substrate to output a light from the side surface of a substrate as well as to suppress the total reflection of light in order to improve poor light extraction performance due to the total reflection of a light emitted from a light-emitting layer at an interface between a sapphire substrate and a nitride semiconductor.

Further, Japanese Patent Application Laid-Open (kokai) No. 2010-225787 discloses that mesas are formed at a boundary between a sapphire substrate and a nitride semiconductor in order to reduce difficulty in extracting the light to the outside due to the total reflection at the interface, as in the Japanese Patent Application Laid-Open (kokai) No. 2010-171382.

However, there is no suggestion in any of the above references that mesas or dents formed on the sapphire substrate generate a light interference pattern. Moreover, there is no suggestion that light extraction performance is improved using the light interference pattern.

SUMMARY OF THE INVENTION

In view of the foregoing, an object of the present invention is to obtain a high-intensity light output in a specific direction for the emitted light by forming a periodic structure comprising at least one of dents and mesas arranged with a period which generates a light interference pattern, on a semiconductor growth surface of a sapphire substrate.

In a first aspect of the present invention, there is provided a Group III nitride semiconductor light-emitting device comprising a sapphire substrate, and a layered structure having a light-emitting layer provided on the sapphire substrate and formed of a Group III nitride semiconductor, wherein the sapphire substrate has a periodic structure on the surface on the layered structure side; and the periodic structure comprises at least one of dents and mesas arranged in a two-dimensional array with a period which generates a light interference pattern for the light emitted from the light-emitting layer.

In the present invention, a light interference pattern is generated by forming a periodic structure of at least one of dents and mesas on the sapphire substrate with a period of a wavelength order of the light emitted from the light-emitting layer. Thus, a high-intensity light output can be obtained in a direction making a predetermined angle with respect to a normal to the sapphire substrate. This allows the improvement of the light extraction performance of the light-emitting device. This periodic structure may be a two-dimensional periodic structure in a direction of two axes at right angles to each other on the sapphire substrate or a periodic structure which is point symmetrical with respect to the center on the sapphire substrate. It may be a two-dimensional periodic lattice structure such as regular polygon including equilateral triangle or regular hexagon, or polygon. Additionally, a two-dimensional array means an array that is periodic in a biaxial direction on a surface. A two-dimensional periodic structure means a structure that is periodic in a biaxial direction.

A shape of one dent or mesa in any cross section perpendicular to a normal to the sapphire substrate may be, for example, any dot shape (island-like), truncated pyramid, truncated conoid, rectangular column, circular column, pyramid, conoid, or hemisphere.

The period of the periodic structure is preferably 4 μm or less. When the period is 4 μm or less, a light interference pattern is generated. When the period exceeds 4 μm, a light interference pattern is difficult to generate. Therefore, the period is preferably 4 μm or less. The light interference pattern varies with period. This can increase the light emission at a desired angle with respect to a normal to the sapphire substrate.

Moreover, the period is preferably 0.1 μm or more and 4 μm or less. When it is smaller than the lower limit of 0.1 μm, a light interference pattern is difficult to generate as well as irregularities are difficult to form. Therefore, the period of the periodic structure preferably falls within this range.

Furthermore, the period is preferably 3.5 μm or less and 0.3 μm or more. More preferably, the period is 3.25 μm or less and 0.7 μm or more. Most preferably, the period is 3.25 μm or less and 2.25 μm or more. When the period falls within this range, a fine light interference pattern having an extreme value with a short period is obtained.

A transparent film may be formed on a light output surface of the Group III nitride semiconductor light-emitting device; and the film has a transmittance distribution that the light transmittance increases in a position where the light intensity is high in the interference pattern appeared on the light output surface. In the interference pattern, it can be considered that the light energy is focused on a portion where the light intensity increases. Therefore, light extraction performance can be improved in a direction where the light intensity increases by forming a transparent film which transmits more light in that direction. The total light output in all directions also increases because the light focused in that direction can be more effectively output to the outside.

Preferably, a light reflecting film may be formed on a light reflecting surface opposite to the light output surface of the Group III nitride semiconductor light-emitting device; and the film has a reflectance distribution that the light reflectance increases in a position where the light intensity is high in the interference pattern appeared on the light reflecting surface. In this case, as is the case with the above, the light is focused in a direction where the light intensity increases. Therefore, light extraction performance can be improved by forming a light reflecting film which effectively reflects more light in that direction on the light extracting surface side.

In the above invention, "Group III nitride semiconductor" encompasses a semiconductor represented by the formula $Al_xGa_yIn_zN$ (x+y+z=1, 0≤x, y, z≤1); such a semiconductor in which a portion of Al, Ga, or In is substituted by another Group 13 element (i.e., B or Tl), or a portion of N is substituted by another Group 15 element (i.e., P, As, Sb, or Bi). Specific examples of the Group III nitride semiconductor include those containing at least Ga, such as GaN, InGaN, AlGaN, and AlGaInN. Generally, Si is used as an n-type impurity, and Mg is used as a p-type impurity.

According to the present invention, a high-intensity light output can be obtained at a desired angle with respect to a normal to the sapphire substrate by forming a periodic structure of dents or mesas arranged in a two-dimensional array with a period which generates a light intensity interference pattern for the light emitted from a light-emitting layer, on the surface on the sapphire substrate surface where a layered structure is provided. Since the light is focused on a region where the interference intensity of the interference pattern is high, the total light output in all directions also increases as well as the light can be output in a specific direction. This results in the increase in the external quantum efficiency of the light-emitting device.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
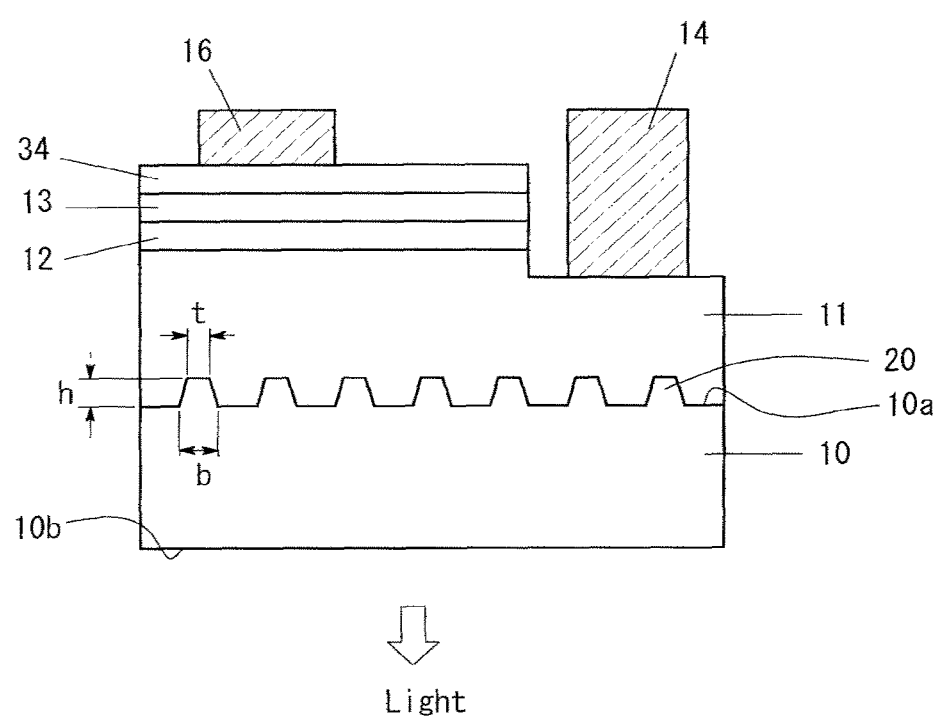
FIG. 1 is a cross-sectional view showing the configuration of a Group III nitride semiconductor light-emitting device according to Embodiment 1.

FIG. 1 is a cross-sectional view showing the configuration of a Group III nitride semiconductor light-emitting device according to Embodiment 1. The Group III nitride semiconductor light-emitting device according to Embodiment 1 includes a sapphire substrate 10 having a two-dimensional periodic structure of mesas 20 on a surface thereof. And the device includes an n-type layer 11, a light-emitting layer 12, and a p-type layer 13, which are sequentially deposited on the surface of the sapphire substrate 10 and the surface of the two-dimensional periodic structure via a buffer layer (not illustrated), and each of which is formed of a Group III nitride semiconductor. The layered structure of the present invention corresponds to a structure including the n-type layer 11, the light-emitting layer 12, and the p-type layer 13. A portion of the light-emitting layer 12 and a portion of the p-type layer 13 are removed by etching, and the corresponding portion of the surface of the n-type layer 11 is exposed. An n-electrode 14 is formed on the exposed portion of the surface of the n-type layer 11. A reflecting film 34 having a uniform thickness is formed on the p-type layer 13. A p-type electrode 16 is formed on the reflecting film 34. The reflecting film 34 comprises at least one of Rh and Ag. An emission wavelength of the light-emitting device is 430 nm to 480 cm. An emission wavelength of a light-emitting device usable in the present invention is 380 nm to 750 nm. The Group III nitride semiconductor light-emitting device according to Embodiment 1 is of a face-down type (flip-chip type).

Each of the n-type layer 11, the light-emitting layer 12, and the p-type layer 13 may have any of conventionally known structures. For example, the n-type layer 11 has a structure in which a GaN n-type contact layer doped with Si at high concentration and a GaN n-cladding layer are sequentially deposited on the sapphire substrate 10. Also the n-type layer 11 may have a multilayer each comprising materials with a different composition ratio to improve electrostatic breakdown voltage. For example, the light-emitting layer 12 has an MQW structure in which GaN barrier layers and InGaN well layers are alternately deposited. For example, the p-type layer 13 has a structure in which an AlGaN p-cladding layer doped with Mg and a GaN p-contact layer doped with Mg are sequentially deposited on the light-emitting layer 12. The n-cladding layer and the p-cladding layer may be a superlattice layer.

The Group III nitride semiconductor light-emitting device according to Embodiment 1 was produced as follows.

Figure 2A:
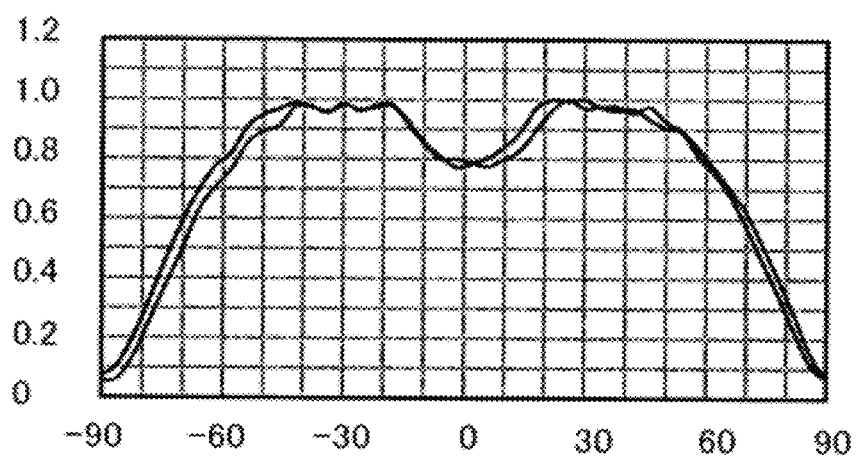
FIG. 2A is a characteristic chart showing the light intensity distribution with respect to the emission angle of the light emitted from the light-emitting device having a periodic structure of mesas with a period of 5 μm according to Embodiment 1.
Figure 2B:
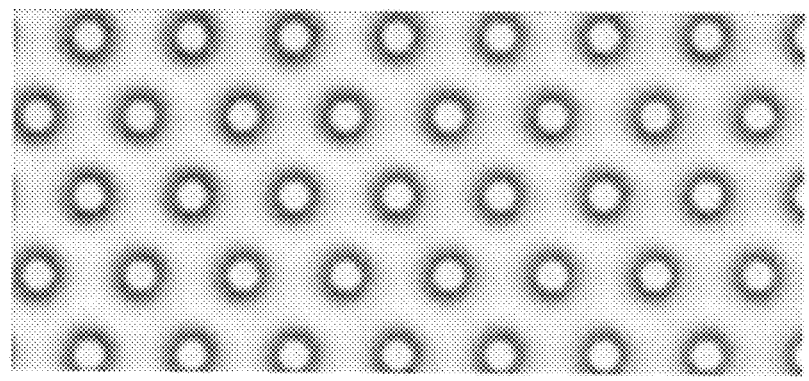
FIG. 2B is a plan view photograph showing the periodic structure of mesas with a period of 5 μm formed on the sapphire substrate of the light-emitting device according to Embodiment 1.

Firstly, a photoresist was applied to the entire surface 10a of the sapphire substrate 10. Then, it was exposed and developed to form a pattern corresponding to a two-dimensional periodic structure of mesas. Next, the sapphire substrate 10 was subjected to dry etching using the remaining two-dimensional periodic structure pattern as a mask. Thus, for example, a two-dimensional periodic structure of mesas 20 as shown in FIG. 2B was obtained.

Subsequently, thermal cleaning was carried out for recovery from damage to the sapphire substrate 10 due to formation of the aforementioned two-dimensional periodic structure, and removing impurities from the surface of the sapphire substrate 10. Thermal cleaning corresponds to, for example, thermal treatment in a hydrogen atmosphere at 1,000° C. to 1,200° C.

Next, on the sapphire substrate 10 on which the two-dimensional periodic structure has been formed as described above, an n-type layer 11, a light-emitting layer 12, and a p-type layer 13 are sequentially formed by MOCVD via an AlN buffer layer (not illustrated). The raw material gases, etc. employed for MOCVD are as follows: ammonia ($NH_3$) as a nitrogen source, trimethylgallium ($Ga(CH_3)_3$) as a Ga source, trimethylindium ($In(CH_3)_3$) as an In source, trimethylaluminum ($Al(CH_3)_3$) as an Al source, silane ($SiR_4$) as an n-type doping gas, cyclopentadienylmagnesium ($Mg(C_5H_5)_2$) as a p-type doping gas, and $H_2$ or $N_2$ as a carrier gas.

Thereafter, a portion of the p-type layer 13 and a portion of the light-emitting layer 12 were removed by dry etching, to thereby expose the corresponding portion of the surface of the n-type layer 11. Then, a reflecting film 34 was formed on the entire top surface of the p-type layer 13; an n-electrode 14 was formed on the thus-exposed portion of the surface of the n-type layer 11; and a p-electrode 16 was formed on the reflecting film 34. Thus, the Group III nitride semiconductor light-emitting device according to Embodiment 1 was produced.

Light-emitting devices were produced by varying the period of the two-dimensional periodic structure of mesas 20 formed on the semiconductor growth surface 10a of the sapphire substrate 10, by the above production method. The emission intensity in the outside of each light-emitting device was measured. As shown in FIGS. 1 and 2B, the mesa 20 of the two-dimensional periodic structure has a circular truncated cone shape, and a trapezoid shape in any cross section perpendicular to the semiconductor growth surface 10a of the sapphire substrate 10. The top base diameter, the bottom base diameter, and the height of each circular truncated cone are t, b, and h, respectively. The side surface angle between the side wall and the base is θ. The mesas 20 are arranged at the vertex and the center of a regular hexagon in any cross section parallel to the semiconductor growth surface 10a of the two-dimensional periodic structure. That is, the two-dimensional periodic structure has a dense honeycomb structure. The period is a distance between the centers of two adjacent mesas 20. Six mesas 20 are adjacent to one mesa 20. The distance from any one mesa 20 to each of six adjacent mesas 20 is always equal.

The light which is emitted from the light-emitting layer 12 to the sapphire substrate 10 is partially reflected by and partially transmitted through the two-dimensional periodic structure of mesas 20. The transmitted light is output to the outside from the light output surface 10b opposite to the semiconductor growth surface 10a of the sapphire substrate 10. The light which is emitted from the light-emitting layer 12 to the reflecting film 34 is reflected to the light output surface 10b by the reflecting film 34. The reflected light is transmitted through the two-dimensional periodic structure of mesas 20, and output to the outside from the light output surface 10b. Also, the light which is reflected to the reflecting film 34 by the two-dimensional periodic structure of mesas 20 is reflected to the light output surface 10b by the reflecting film 34, transmitted through the two-dimensional periodic structure of mesas 20, and output to the outside from the light output surface 10b. With such mechanisms of transmission and reflection by the above two-dimensional periodic structure of mesas 20 and of reflection by the reflecting film 34, the light emitted from the light-emitting layer 12 is output to the outside from the light output surface 10b. Therefore, the light output from the light output surface 10b has an interference pattern due to the existence of the two-dimensional periodic structure.

FIG. 2B is a plan view photograph showing the two-dimensional periodic structure of mesas where the period is 5 μm, the top base diameter t is 1.0 μm, the bottom base diameter b is 2.8 μm, the height h is 1.5 μm, and the side surface angle θ is 59°. FIG. 2A shows the light intensity distribution of the light-emitting device with respect to the angle between any direction and a normal direction to the light output surface 10b, i.e., an optical axis. That is, it shows the light intensity distribution on the hemispherical surface, i.e. the directional characteristics of the emitted light on any cross section cut by a plane including a normal to the sapphire substrate 10. The two curves show the directional characteristics in two perpendicular cross sections. In other words, two axes at right angles to each other (x-axis and y-axis) are set on the light output surface 10b. One curve shows the characteristics with respect to the angle measured from a normal direction to the x-axis, and the other curve shows the characteristics with respect to the angle measured from a normal direction to the y-axis. The light intensity is measured in a range of −90° to 90° from a normal. The center, right end and left end of the horizontal axis are a normal direction (0°), 90° from a normal (horizontal direction), and −90° from a normal, respectively. One scale is 10 degrees. The vertical axis is a relative light intensity, and one scale is 0.1. Hereinafter, the definition of the light intensity distribution chart showing the directional characteristics of the emitted light is the same as that of FIG. 2A.

Figure 3A:
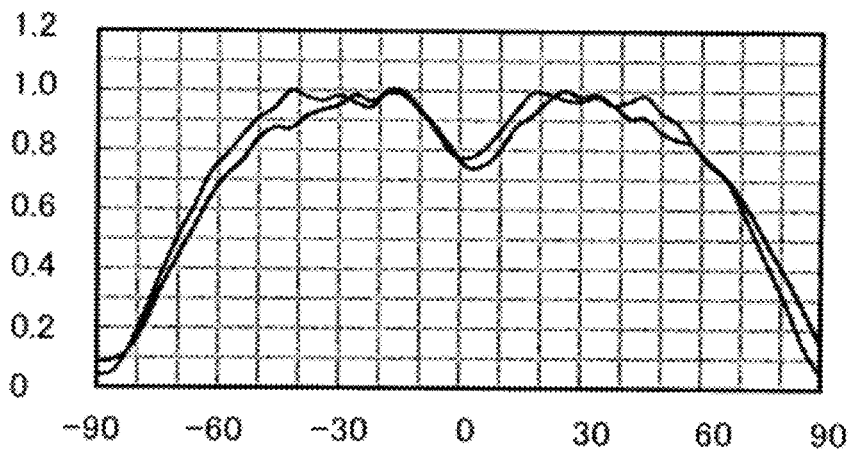
FIG. 3A is a characteristic chart showing the light intensity distribution with respect to the emission angle of the light emitted from the light-emitting device having a periodic structure of mesas with a period of 4 μm according to Embodiment 1.
Figure 3B:
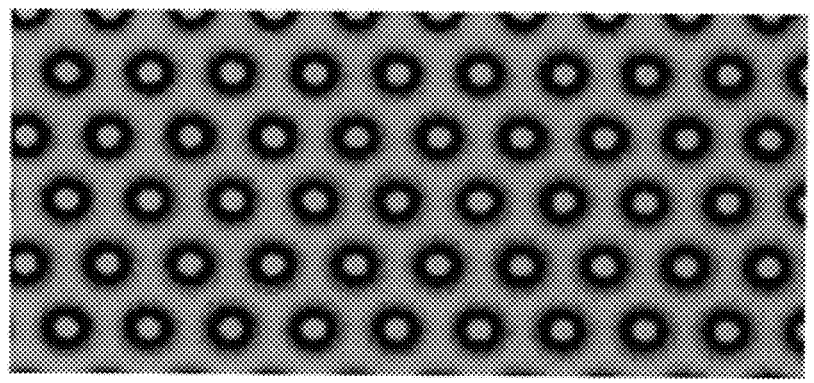
FIG. 3B is a plan view photograph showing the periodic structure of mesas with a period of 4 μm formed on the sapphire substrate of the light-emitting device according to Embodiment 1.
Figure 7A:
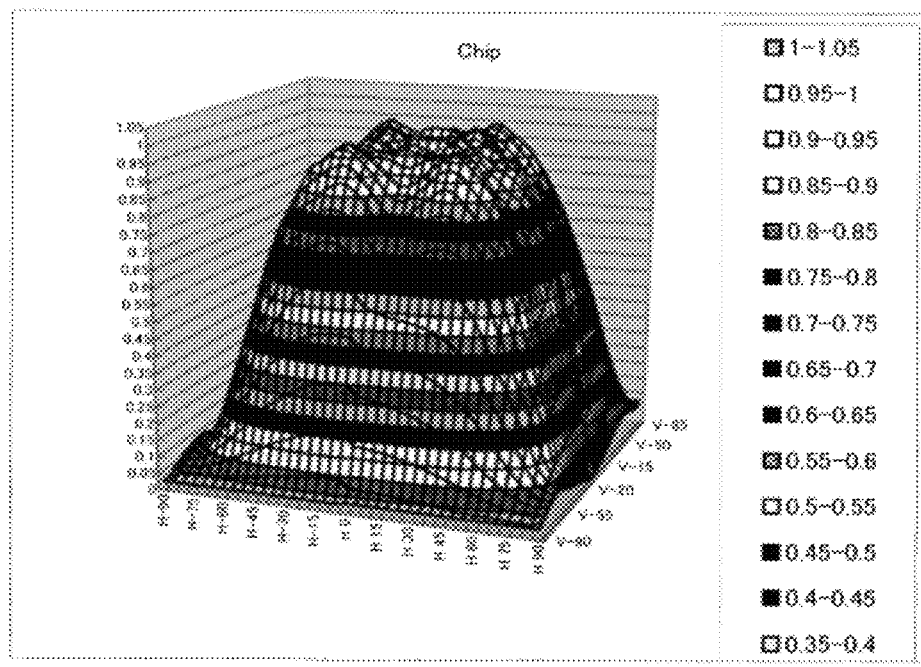
FIG. 7A is a perspective three-dimensional chart plotting the light intensity distribution on the hemispherical surface of the light emitted from the light-emitting device having a periodic structure of mesas with a period of 4 μm according to Embodiment 1.
Figure 7B:
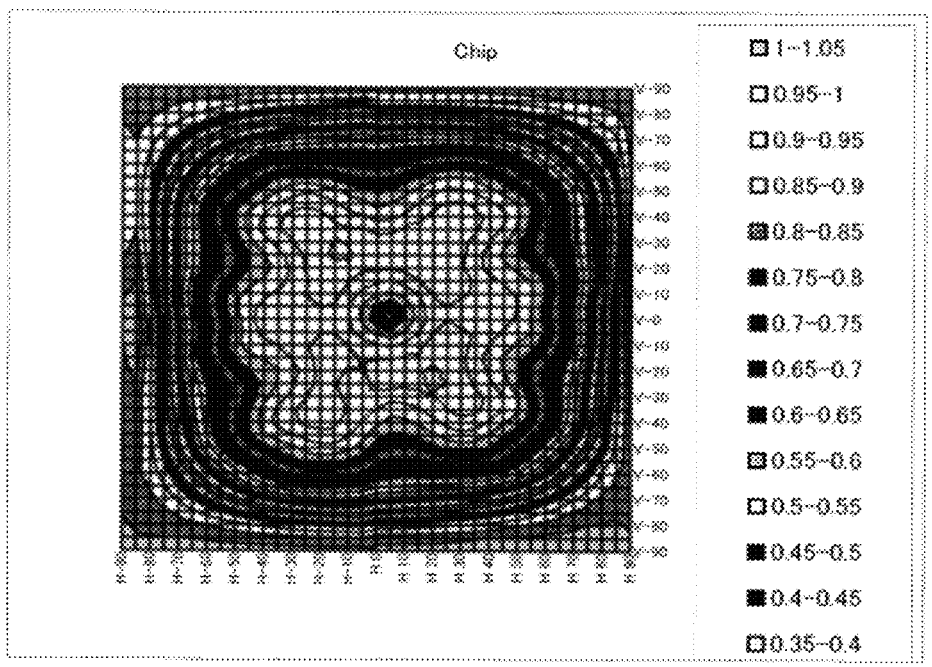
FIG. 7B is an isointensity contour chart plotting the light intensity distribution on the hemispherical surface of the light emitted from the light-emitting device having a periodic structure of mesas with a period of 4 μm according to Embodiment 1.

FIG. 3B is a plan view photograph showing the two-dimensional periodic structure of mesas where the period is 4 μm, the top base diameter t is 1.0 μm, the bottom base diameter b is 2.8 μm, the height h is 1.5 μm, and the side surface angle θ is 59°. FIG. 3A shows the light intensity distribution of the light-emitting device having the above structure. FIG. 7A shows the light intensity distribution on the hemispherical surface of the light-emitting device. FIG. 7B shows the two-dimensional light intensity distribution chart developed from the light intensity distribution chart on the hemispherical surface.

Figure 4A:
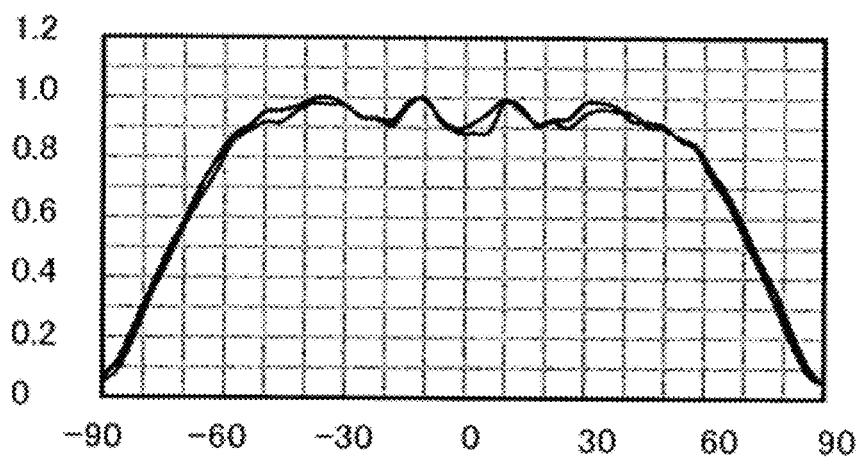
FIG. 4A is a characteristic chart showing the light intensity distribution with respect to the emission angle of the light emitted from the light-emitting device having a periodic structure of mesas with a period of 3.25 μm according to Embodiment 1.
Figure 4B:
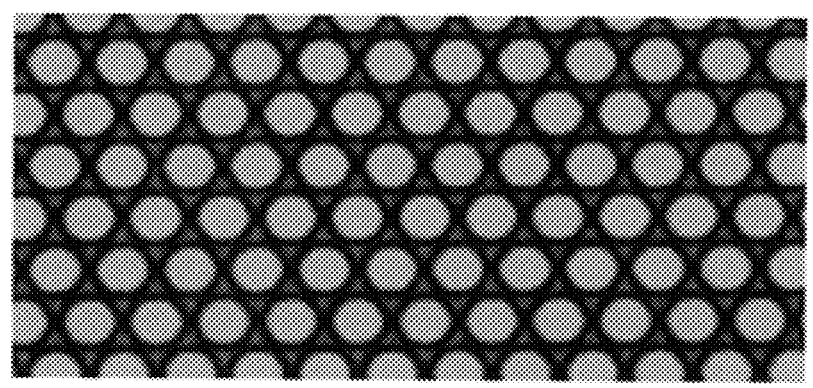
FIG. 4B is a plan view photograph showing the periodic structure of mesas with a period of 3.25 μm formed on the sapphire substrate of the light-emitting device according to Embodiment 1.

FIG. 4B is a plan view photograph showing the two-dimensional periodic structure of mesas where the period is 3.25 μm, the top base diameter t is 2.44 μm, the bottom base diameter b is 2.73 μm, the height h is 0.87 μm, and the side surface angle θ is 81°. FIG. 4A shows the light intensity distribution of the light-emitting device having the above structure.

Figure 5A:
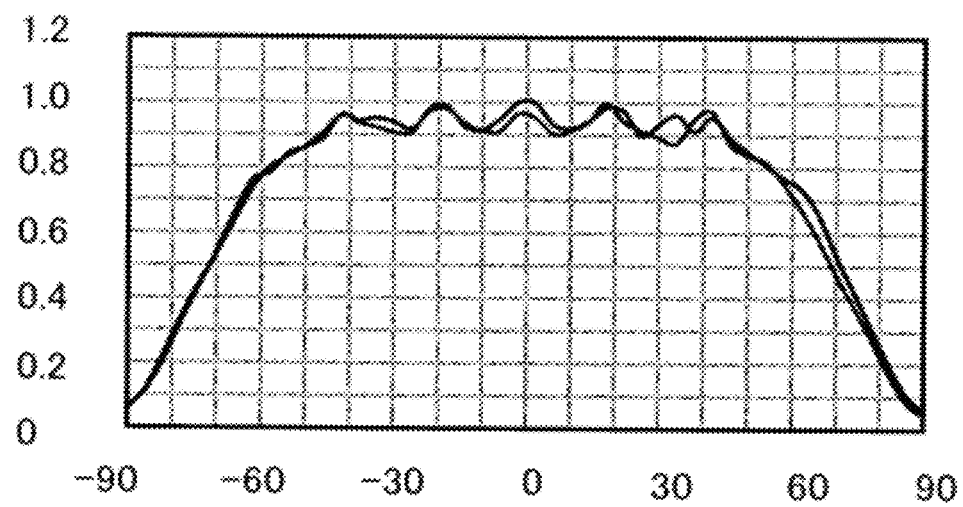
FIG. 5A is a characteristic chart showing the light intensity distribution with respect to the emission angle of the light emitted from the light-emitting device having a periodic structure of mesas with a period of 2.75 μm according to Embodiment 1.
Figure 5B:
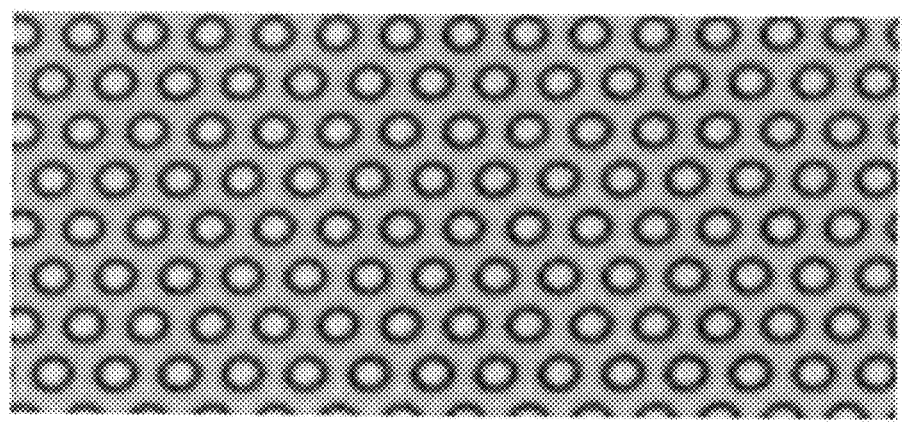
FIG. 5B is a plan view photograph showing the periodic structure of mesas with a period of 2.75 μm formed on the sapphire substrate of the light-emitting device according to Embodiment 1.
Figure 8A:
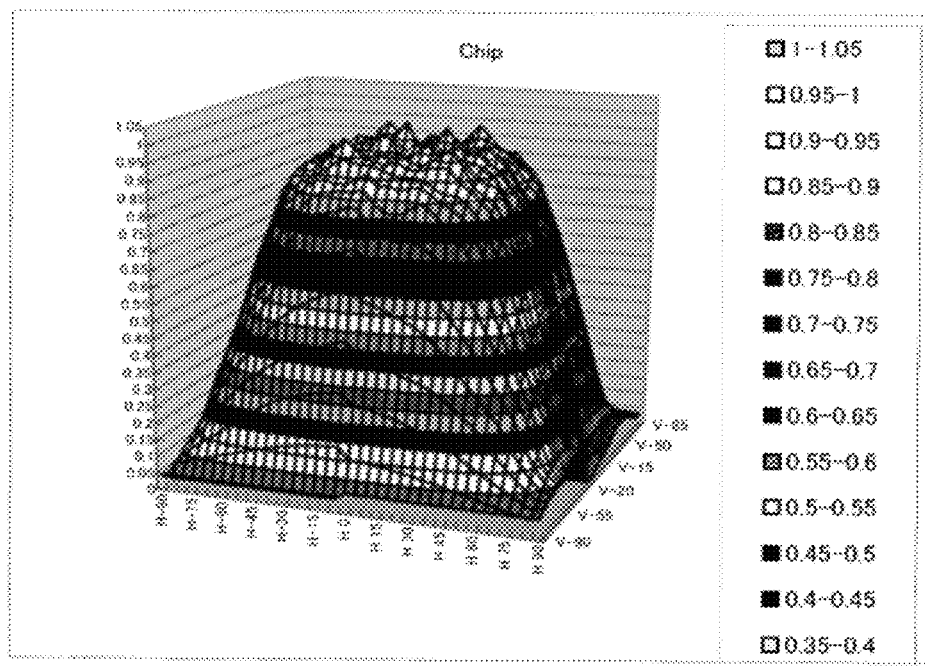
FIG. 8A is a perspective three-dimensional chart plotting the light intensity distribution on the hemispherical surface of the light emitted from the light-emitting device having a periodic structure of mesas with a period of 2.75 μm according to Embodiment 1.
Figure 8B:
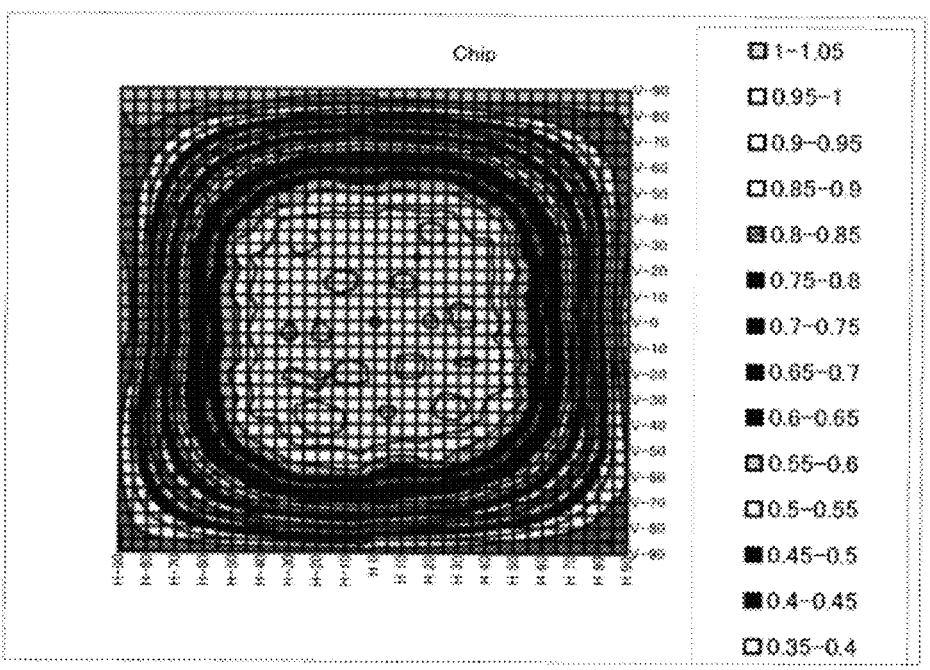
FIG. 8B is an isointensity contour chart plotting the light intensity distribution on the hemispherical surface of the light emitted from the light-emitting device having a periodic structure of mesas with a period of 2.75 μm according to Embodiment 1.

FIG. 5B is a plan view photograph showing the two-dimensional periodic structure of mesas where the period is 2.75 μm, the top base diameter t is 1.24 μm, the bottom base diameter b is 2.16 μm, the height h is 1.14 μm, and the side surface angle θ is 70°. FIG. 5A shows the light intensity distribution of the light-emitting device having the above structure. FIG. 8A shows the light intensity distribution on the hemispherical surface of the light-emitting device. FIG. 8B shows the two-dimensional light intensity distribution chart developed from the light intensity distribution chart on the hemispherical surface.

Figure 6A:
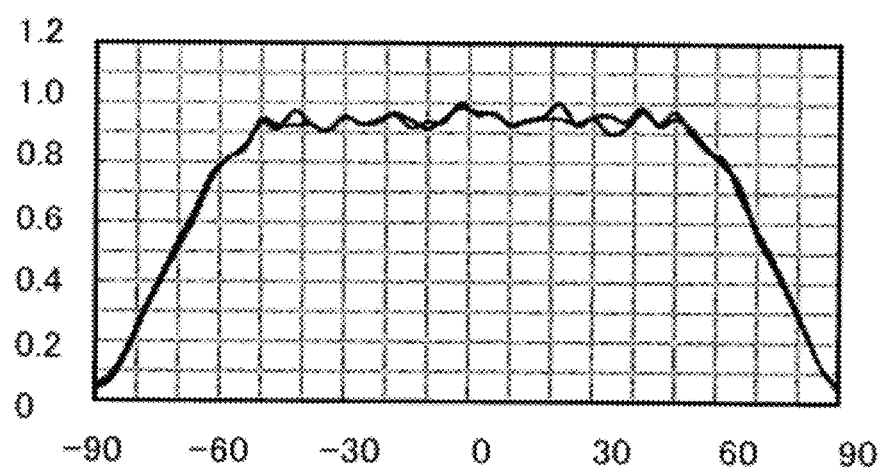
FIG. 6A is a characteristic chart showing the light intensity distribution with respect to the emission angle of the light emitted from the light-emitting device having a periodic structure of mesas with a period of 2.25 μm according to Embodiment 1.
Figure 6B:
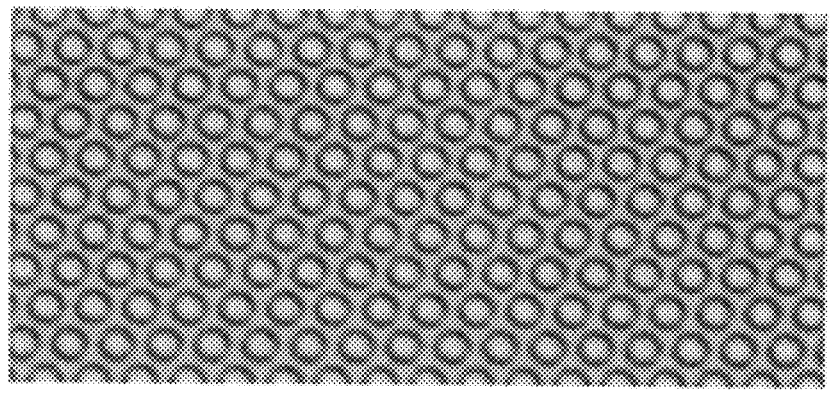
FIG. 6B is a plan view photograph showing the periodic structure of mesas with a period of 2.25 μm formed on the sapphire substrate of the light-emitting device according to Embodiment 1.
Figure 9A:
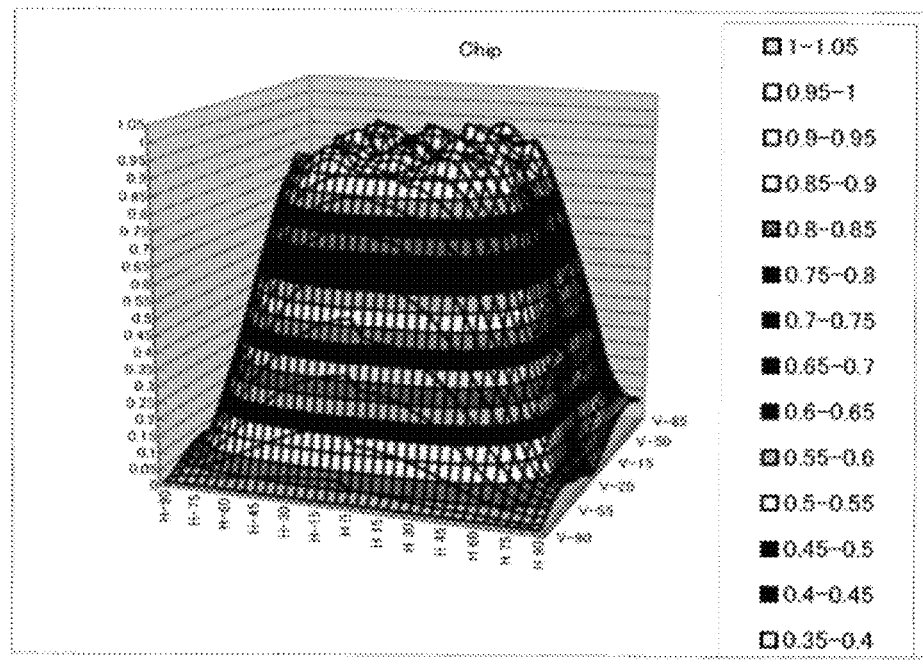
FIG. 9A is a perspective three-dimensional chart plotting the light intensity distribution on the hemispherical surface of the light emitted from the light-emitting device having a periodic structure of mesas with a period of 2.25 μm according to Embodiment 1.
Figure 9B:
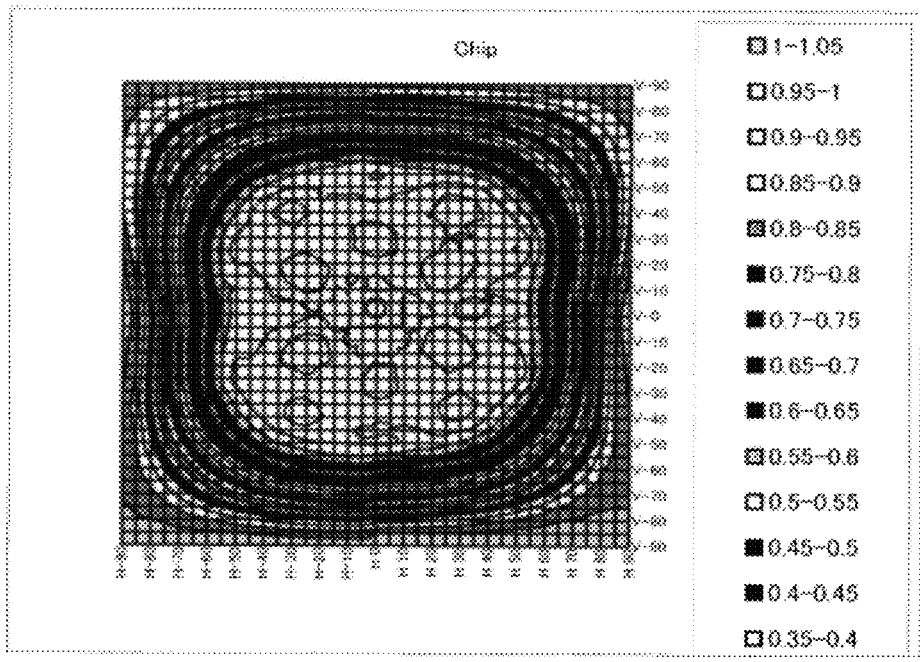
FIG. 9B is an isointensity contour chart plotting the light intensity distribution on the hemispherical surface of the light emitted from the light-emitting device having a periodic structure of mesas with a period of 2.25 μm according to Embodiment 1.

FIG. 6B is a plan view photograph showing the two-dimensional periodic structure of mesas where the period is 2.25 μm, the top base diameter t is 0.98 μm, the bottom base diameter b is 1.89 μm, the height h is 1.22 μm, and the side surface angle θ is 69°. FIG. 6A shows the light intensity distribution of the light-emitting device having the above structure. FIG. 9A shows the light intensity distribution on the hemispherical surface of the light-emitting device. FIG. 9B shows the two-dimensional light intensity distribution chart developed from the light intensity distribution chart on the hemispherical surface.

As is clear from FIG. 2A, when the two-dimensional periodic structure with a period of 5 μm is used, the light intensity in ranges of 20° to 50° and −20° to −50° is 1.25 times larger than that at 0° (a normal direction).

As is also clear from FIG. 3A, when the two-dimensional periodic structure with a period of 4 μm is used, the intensity in ranges of 20° to 40° and −15° to −35° is 1.33 times larger than that at 0° (a normal direction). In FIG. 7A, several peaks of light intensity can be seen.

As is apparent from FIG. 4A, when the two-dimensional periodic structure with a period of 3.25 μm is used, the light intensity is between 1 and 0.9 in a range of −50° to +50°. However, four peaks of light intensity can be seen at −10°, +10°, −35°, and +35°.

As is also apparent from FIG. 5A, when the two-dimensional periodic structure with a period of 2.75 μm is used, the light intensity is between 1 and 0.9 in a range of −45° to +45°. However, five peaks of light intensity can be seen at −40°, −20°, 0°, +20°, and +40° or 35°. This will be better understood with reference to FIG. 8A.

As is obvious from FIG. 6A, when the two-dimensional periodic structure with a period of 2.25 μm is used, the light intensity is between 1 and 0.9 in a range of −50° to +50°. However, a small peak can be seen at approximately every 10°. This will be better understood with reference to FIGS. 9A and 9B. From FIGS. 7B, 8B, and 9B, it is found that the directional characteristics have a six-fold rotational symmetry. As the period is smaller, a six-fold rotational symmetry more remarkably appears. The six-fold rotational symmetry shown in FIGS. 7B, 8B, and 9B exhibits a reciprocal lattice of the two dimensional periodic structure.

It is clear from the above that the smaller the period, the less variation in the light intensity distribution in a wide angle range including a normal. It is also clear that the smaller the period, the smaller the angle interval at which a small peak appears. In the above experiment, it was found that a fine interference pattern was formed when the period was 3.25 μm or less and 2.25 μm or more.

Embodiment 2

Figure 10:
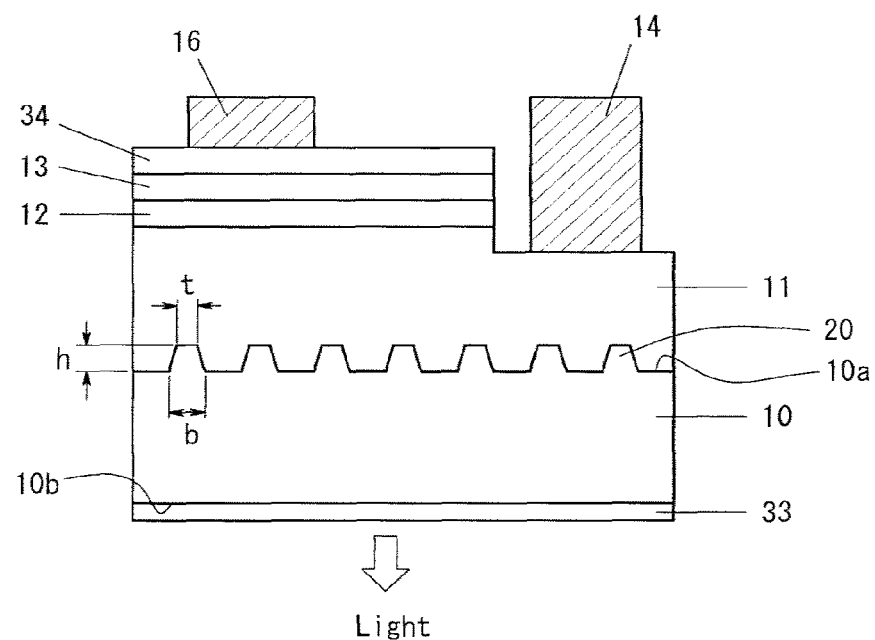
FIG. 10 is a cross-sectional view showing the configuration of a Group III nitride semiconductor light-emitting device according to Embodiment 2.

FIG. 10 shows the configuration of a light-emitting device according to Embodiment 2 utilizing a light intensity interference pattern. A multilayer transparent film 33 comprising a plurality of layers with a different refractive index was formed on the light output surface 10b of the sapphire substrate 10 in the light-emitting device according to Embodiment 1. The multilayer transparent film 33 is designed to have a thickness of each layer so that more light is transmitted at an angle where the light intensity increases in the light intensity distribution (interference pattern) of the light transmitted through the two-dimensional periodic structure of mesas 20. By this thickness design, the interference pattern of the transmitted light through the multilayer transparent film 33 can be the same as that of the emitted light from the two-dimensional periodic structure of mesas 20. Thus, the light in a direction where the light intensity increases in the light intensity distribution of the emitted light from the two-dimensional periodic structure of mesas 20 can be more extracted from the light output surface 10*b*, and the light can be effectively output from the light output surface 10*b*. That is, the light having a high intensity in a specific direction can be output to the outside. Also, the light emitted from the light-emitting layer 12 is considered to be focused on a region where the light intensity is high in the interference pattern, resulting in increasing the overall light output efficiency.

Embodiment 3

Figure 11:
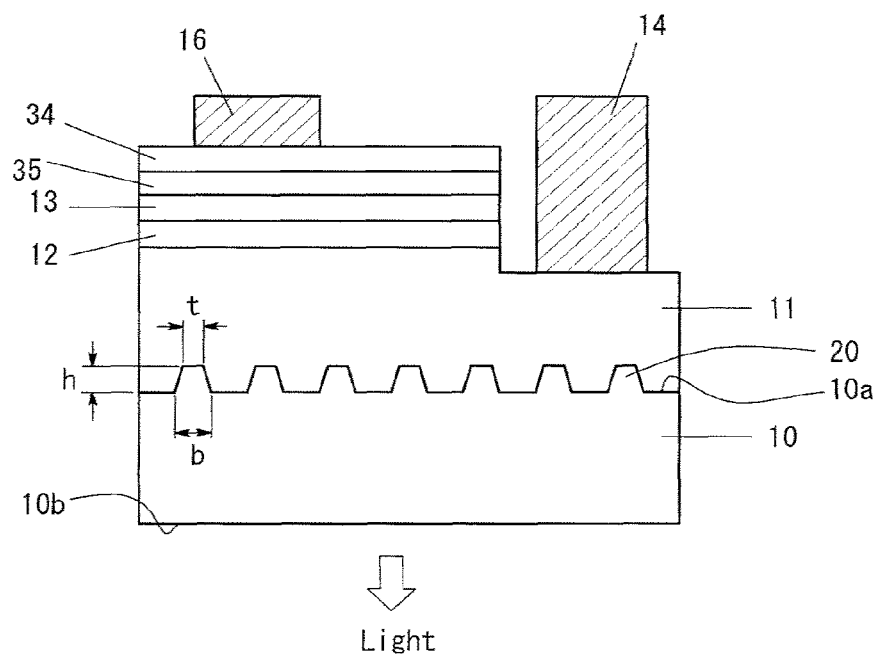
FIG. 11 is a cross-sectional view showing the configuration of a Group III nitride semiconductor light-emitting device according to Embodiment 3.

As shown in FIG. 11, the present embodiment comprises a multilayer reflecting film (DBR) 35 between the reflecting film 34 also serving as an electrode and the p-type layer 13 in the light-emitting device according to Embodiment 1. The multilayer reflecting film 35 also comprises a plurality of dielectric layers with a different refractive index deposited in the same way as the multilayer transparent film 33 of Embodiment 2. The light which is emitted from the light-emitting layer 12 to the multilayer reflecting film 35 is reflected to the light output surface 10*b* by the multilayer reflecting film 35. The light which is emitted from the light-emitting layer 12 to the periodic structure of mesas 20 is reflected to the multilayer reflecting film 35 by the periodic structure. And the light which incidents to the multilayer reflecting film 35 is reflected to the periodic structure of mesas 20 by the multilayer reflecting film 35. The multilayer reflecting film 35 is designed to have a thickness of each layer so that more light is reflected at an angle where the light intensity increases in the intensity distribution of the light reflected by the periodic structure of mesas 20. By this thickness design, the interference pattern of the light reflected by the multilayer reflecting film 35 can be the same as that generated by the periodic structure of mesas 20. Thus, the light in a direction where the light intensity increases in the intensity distribution generated by the periodic structure of mesas 20 can be more extracted from the light output surface 10*b*, and the light can be effectively output to the outside. That is, the light having a high intensity in a specific direction can be output to the outside. Also, the light emitted from the light-emitting layer 12 is considered to be focused on a region where the light intensity is high in the interference pattern, resulting increasing the overall light output efficiency.

Figure 12:
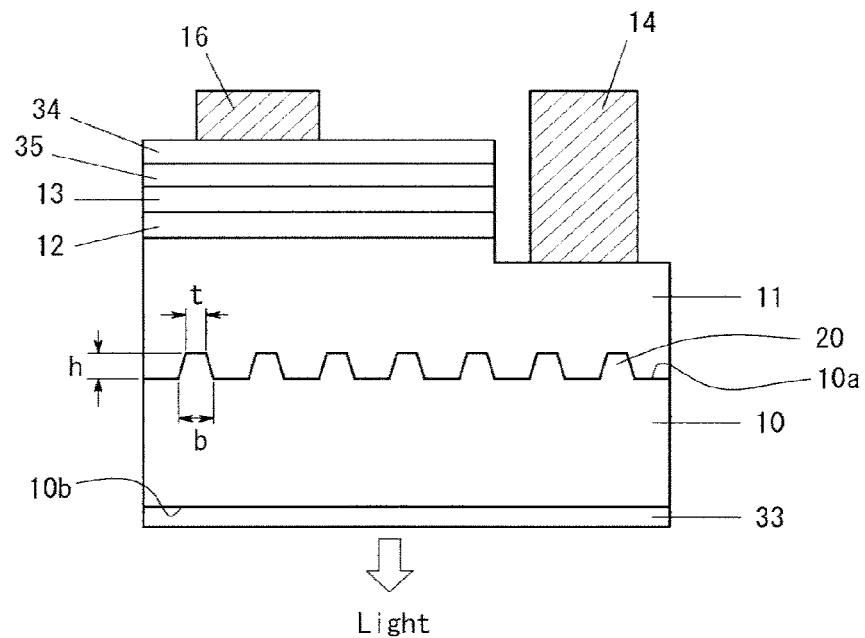
FIG. 12 is a cross-sectional view showing the configuration of a Group III nitride semiconductor light-emitting device according to Embodiment 3.

In this case, as shown in FIG. 12, a multilayer transparent film 33 having an interference pattern in the transmission characteristics may be formed on the light output surface 10*b* of the sapphire substrate 10 as in Embodiment 2. The light output from the light output surface 10*b* can have the same intensity distribution as the interference pattern generated by the periodic structure of mesas 20.

Embodiment 4

Figure 13:
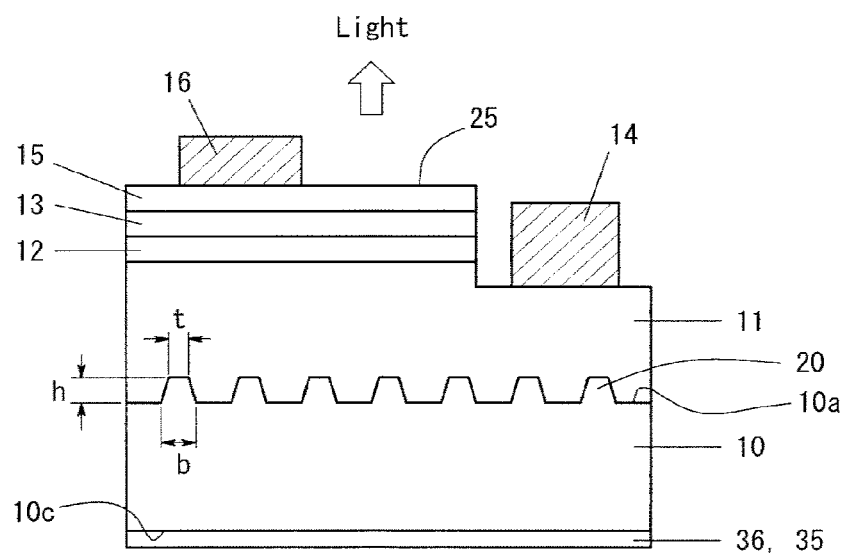
FIG. 13 is a cross-sectional view showing the configuration of a Group III nitride semiconductor light-emitting device according to Embodiment 4.

The light-emitting devices according to Embodiments 1 to 3 are of a face-down type (flip-chip type) wherein a light is output from the light output surface 10*b* being the back side of the sapphire substrate 10. Embodiment 4 is an example wherein the present invention is applied to a face-up type (wire-bonding type) light-emitting device. As shown in FIG. 13, a reflecting film 36 having a uniform thickness is formed on a back side 10*c* of the sapphire substrate 10. The reflecting film 36 comprises at least one of Rh and Ag. A transparent electrode 15 comprising indium tin oxide (ITO) is formed on almost the entire top surface of the p-type layer 13. A p-electrode 16 is formed on the transparent electrode 15. Even this configuration enables the light to be focused in a direction where the light intensity is high in the intensity distribution (interference pattern) of the light transmitted through or reflected by the two-dimensional periodic structure of mesas 20 to effectively output from a light output surface 25 of the transparent electrode 15 in the same way as Embodiments 1 to 3.

In this case, as substitute for the reflecting film 36, a multilayer reflecting film 35 having the same composition as that of the multilayer reflecting film 35 used in Embodiment 3 may be formed on the back side 10*c* of the sapphire substrate 10. The multilayer reflective film 35 comprises a plurality of dielectric layers with a different refractive index deposited. The light emitted from the light-emitting layer 12 to the back side 10*c* is transmitted through the periodic structure of mesas 20, reflected by the multilayer reflecting film 35, and transmitted through the periodic structure of mesas 20 again. Each layer in the multilayer reflecting film 35 is designed to have a thickness so that the light is more reflected at an angle where the light intensity increases in the intensity distribution of the light incident to the multilayer reflecting film 35. By this thickness design, the interference pattern of the reflected light can be the same as that generated by the periodic structure of mesas 20. Thus, the light in a direction where the light intensity increases in the intensity distribution generated by the periodic structure of mesas 20 can be more extracted from the light output surface 25 of the transparent electrode 15, and the light can be effectively output to the outside.

Figure 14:
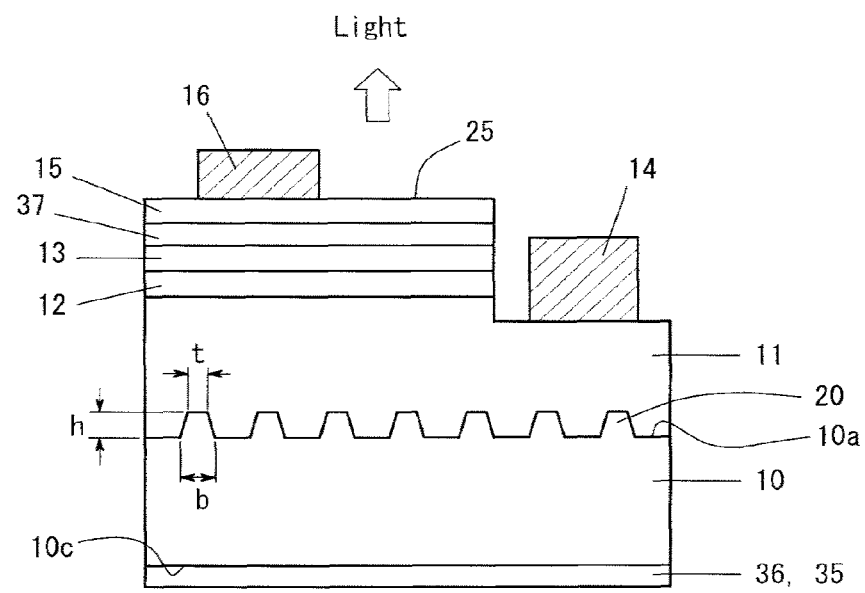
FIG. 14 is a cross-sectional view showing the configuration of a Group III nitride semiconductor light-emitting device according to Embodiment 4.

As shown in FIG. 14, a multilayer transparent film 37 may be formed between the p-type layer 13 and the transparent electrode 15. The transmission directional characteristics of the multilayer transparent film 37 are the same as the interference pattern generated by the two-dimensional periodic structure of mesas 20. Therefore, the interference pattern is generated in the light which is transmitted through the two-dimensional periodic structure of mesas 20 to be reflected by at least one of the reflecting film 36 and the multilayer reflecting film 35 and transmitted to the transparent electrode 15 through the two-dimensional periodic structure of mesas 20 again. Accordingly the light focused in a direction where the light intensity increases in the intensity distribution (interference pattern) can be effectively output to the outside from the light output surface 25 of the transparent electrode 15.

Embodiment 5

Figure 15:
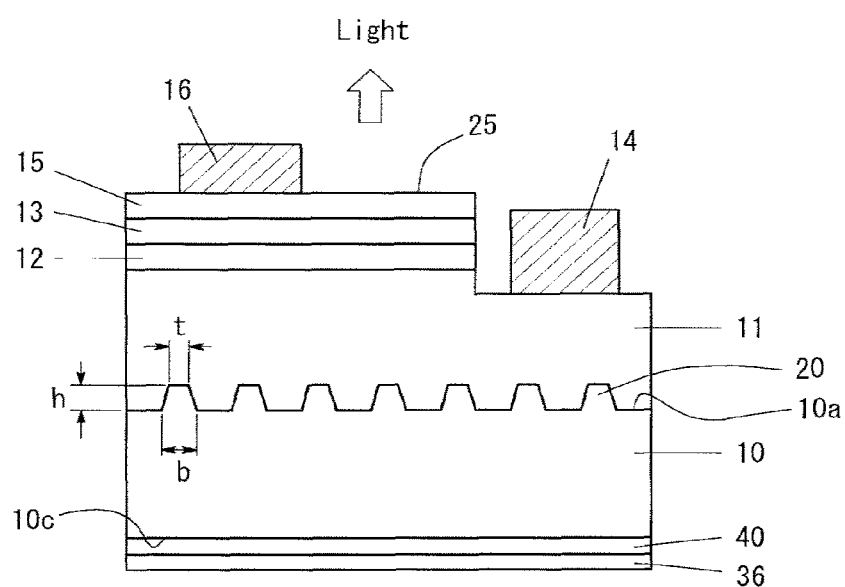
FIG. 15 is a cross-sectional view showing the configuration of a Group III nitride semiconductor light-emitting device according to Embodiment 5.

Embodiment 5 is an example that the present invention is applied to a face-up type (wire-bonding type) light-emitting device. As shown in FIG. 15, a multilayer reflecting (DBR) film 40 is formed in contact with the back side 10*c* of the sapphire substrate 10, and a reflecting film 36 comprising Ag is formed in contact with the DBR film 40. The DBR film 40 of the light-emitting device A comprises five sets of films deposited, and each set of films comprises a ZnO film having a specific refractive index of 2 and a thickness of 56.3 nm, and a $SiO_2$ film having a specific refractive index of 1.46 and a thickness of 77.1 nm. The ZnO film is in contact with the sapphire substrate 10. An ITO transparent electrode 15 is formed on almost the entire top surface of the p-type layer 13. A p-electrode 16 is formed on the transparent electrode 15. The two-dimensional periodic structure of mesas 20 shown in FIG. 6B is used in which the period is 2.25 μm, the top base diameter t is 0.98 μm, the bottom base diameter b is 1.89 μm, the height h is 1.22 μm, and the side surface angle θ is 69°. Other configuration is the same as that of the light-emitting device according to Embodiment 4.

The DBR film 40 is designed for each layer to have a refractive index and a thickness for the emitted light having a wavelength of 450 nm so that the intensity of the light transmitted through the transparent electrode 15 is maximum when the polar angle is 0°, the polar angle being defined as an angle measured from a normal perpendicular to the main surface of the sapphire substrate 10. With provision of the DBR film 40, the light which is existed around the polar angle of 0° in the intensity distribution shown in FIG. 9B generated by the two-dimensional periodic structure of mesas 20 can be strongly output. Thus, emitting light whose intensity is maximum at the polar angle of 0°, has an uniform distribution in the azimuthal angle direction on the main surface, and has uniform directional characteristics in a relatively wide range of polar angle can be obtained.

The following DBR film 40 was studied for the light-emitting device B, which comprises five sets of films, and each set of films comprises a ZnO film having a specific refractive index of 2 and a thickness of 57.1 nm and a $SiO_2$ film having a specific refractive index of 1.46 and a thickness of 79.3 nm. The DBR film 40 is designed for each layer to have a refractive index and thickness so that the light intensity is maximum at the polar angle of 20°. Other configuration is the same as that of the light-emitting device A. Provision of the DBR film 40 can achieve the light emission directional characteristics where the light intensity is maximum when the polar angle is in a range of 20° to 40°. That is, the light intensity can be increased in a polar angle range of 20° to 40° as compared with other polar angle range in the intensity distribution of the light generated by the two-dimensional periodic structure of mesas 20.

Figure 16:
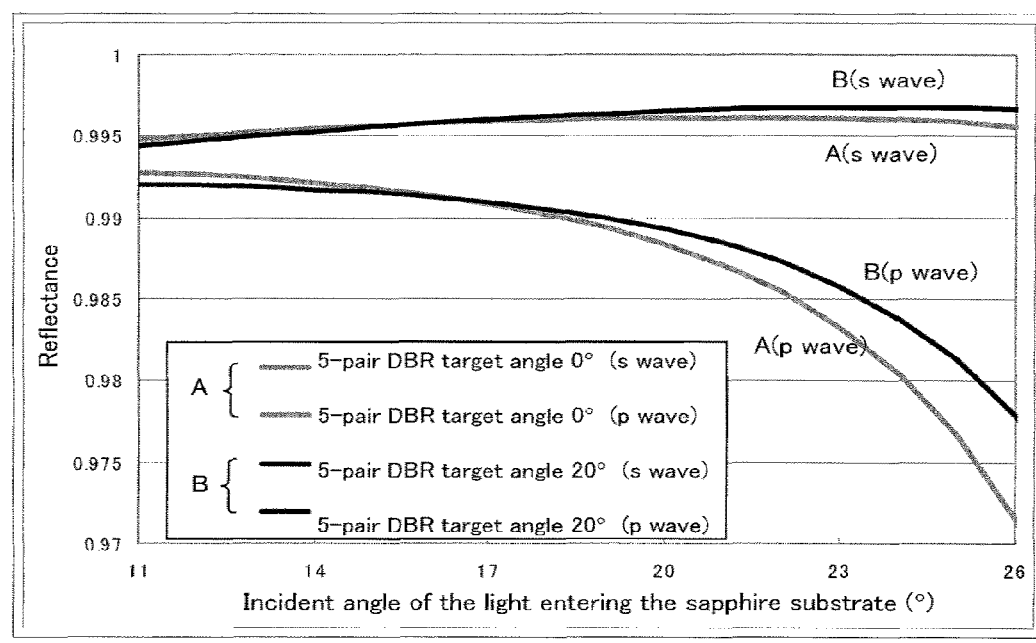
FIG. 16 is a characteristic chart showing the relationship between the incident angle of the light entering the sapphire substrate from the light-emitting layer and the reflectance of the Distributed Bragg Reflector (DBR) film.

FIG. 16 shows the relationship between the reflectance of the DBR film 40 in the light-emitting devices A and B and the incident angle at which the light enters the sapphire substrate 10 from the light-emitting layer 12. In the light-emitting device A designed so that the light output is maximum when the polar angle is 0°, the reflectance of both p wave and s wave by the DBR film 40 can be larger in a polar angle range of 16° or less, as compared with the light-emitting device B designed so that the light output is maximum when the polar angle is 20°. Especially, the difference in reflectance between the light-emitting devices A and B is the largest when the polar angle is around 0°. However, the light emitted in a wide angle range from the light-emitting layer 12 cannot be effectively reflected to the light output surface 25. In the light-emitting device B having the DBR film 40 designed so that the light output is maximum when the polar angle is 20°, the reflectance of both s wave and p wave by the DBR film 40 is larger when the incident angle of the light entering the sapphire substrate 10 exceeds 16° although the reflectance is smaller when the incident angle falls within a range of 0° to 16°, as compared with the light-emitting device A having the DBR film 40 designed so that the light output is maximum when the polar angle is 0°. Therefore, in the light-emitting device B, the light emitted in a wide range of 16° or more (remarkably 20° or more) from the light-emitting layer 12 can be effectively reflected to the light output surface 25. That is, it indicates that the characteristics as designed are obtained.

Embodiment 6

Figure 17:
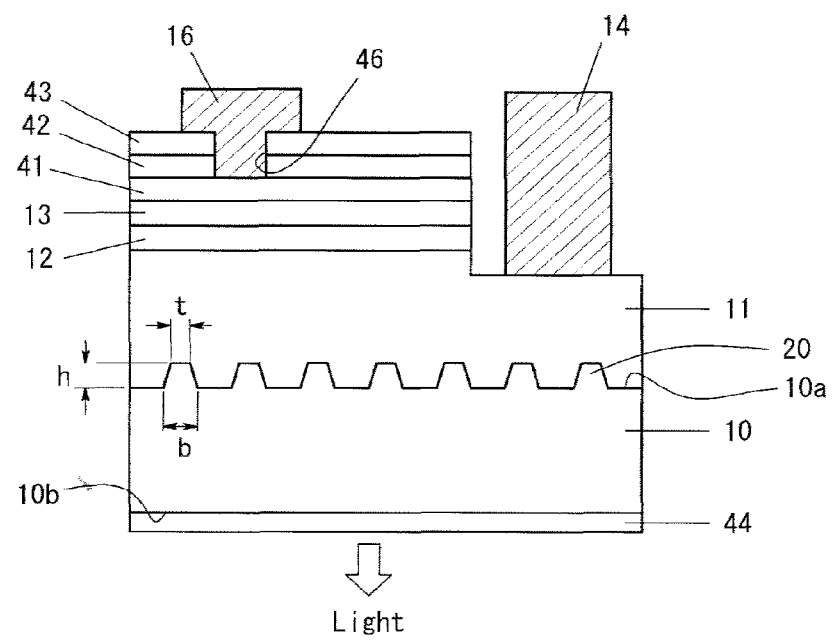
FIG. 17 is a cross-sectional view showing the configuration of a Group III nitride semiconductor light-emitting device according to Embodiment 6.
Figure 18:
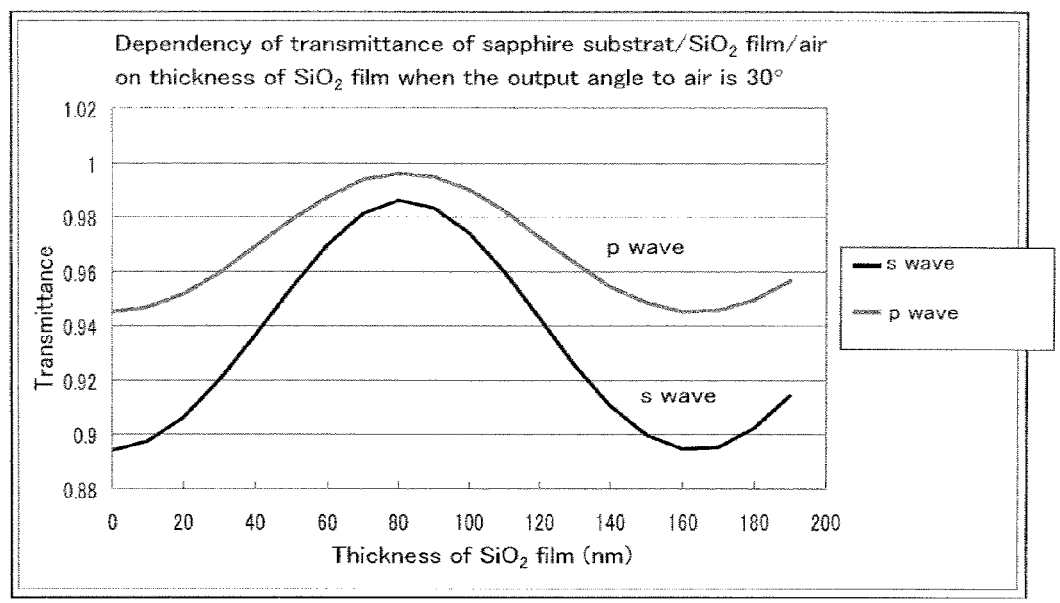
FIG. 18 is a characteristic chart showing the relationship between the thickness of the transparent film and the light transmittance of the Group III nitride semiconductor light-emitting device according to Embodiment 6.

In the light-emitting device according to Embodiment 6, as shown in FIG. 17, an ITO transparent electrode 41 having a thickness of 100 nm is formed on a p-type layer 13, a DBR film 42 having a thickness of 682 nm in which $SiO_2$ and $ZnO_2$ are alternately deposited is formed on the transparent electrode 41, an Ag reflecting film 43 having a thickness of 100 μm is formed on the DBR film 42, and a p-electrode 16 is formed on the reflecting film 43, in the light-emitting device according to Embodiment 1. The p-electrode 16 electrically contacts the transparent electrode 41 via a hole 46 formed on the DBR film 42. On the light output surface 10b being the back side of the sapphire substrate 10, a $SiO_2$ transparent film 44 is formed. FIG. 18 shows the relationship between the thickness of the transparent film 44 and the transmittance of the light transmitted through the transparent film 44 for the light having a wavelength of 450 nm in the above light-emitting device. The transmittance of the transmitted light (both p wave and s wave) is maximum when the thickness of the transparent film 44 is 80 nm. The transmittance of the transmitted light (p wave) is 0.98 or more when the thickness of the transparent film 44 is 50 nm or more and 110 nm or less. The transmittance of the transmitted light (s wave) is 0.98 or more when the thickness of the transparent film 44 is 70 nm or more and 95 nm or less.

The above structure enables the light to be effectively output, resulting in the improvement of external quantum efficiency of the light emitting device.

The side surface of mesas 20 may be formed perpendicular or inclined to the growth surface 10a being the main surface of the sapphire substrate 10. The side surface angle θ to the growth surface 10a is preferably 40° to 90° because the light extraction performance is further improved. More preferably, the height h of mesas 20 having a side surface angle θ of 45° to 75° is 0.1 μm to 3 μm because the light extraction performance is further improved. Further preferably, the height is 0.5 μm to 2 μm.

In the above embodiments, the two-dimensional periodic structure comprises mesas projected from the main surface of the sapphire substrate. On the contrary, it may comprise dents formed on the main surface of the sapphire substrate. The period, depth, and side surface angle of dents may be preferably within the range of those when the two-dimensional periodic structure comprises mesas.

The Group III nitride semiconductor light-emitting device of the present invention can be employed in, for example, a display apparatus or an illumination apparatus.

What is claimed is:

1. A Group III nitride semiconductor light-emitting device, comprising:
    a sapphire substrate; and
    a layered structure comprising a light-emitting layer provided on the sapphire substrate and including a Group III nitride semiconductor,
    wherein the sapphire substrate comprises a periodic structure on a surface on a side with the layered structure,
    wherein the periodic structure comprises at least one of dents and mesas arranged in a two-dimensional periodic array with a period which provides a dense honeycomb structure, in which a distance from any one of the dents or mesas to each of six adjacent dents or mesas is equal, and the periodic structure generates a light intensity interference pattern with a six-fold rotational symmetry for light emitted from the light-emitting layer, and
    wherein the period is from 2.25 μm to 3.25 μm, the periodic structure has a height of 0.5 μm to 2 μm, a side surface angle between a side wall and a base of one of the dents or mesas is 45° to 75°, a relative light intensity falls within a range of 1 to 0.9 when an emission angle of light emitted from the light-emitting device falls within a range of −45° to 45°.

2. A Group III nitride semiconductor light-emitting device according to claim 1, wherein a transparent film is formed on a light output surface, and
    wherein the transparent film includes a transmittance distribution such that a light transmittance is increased in a position where the light intensity is high in the interference pattern appearing on the light output surface.

3. A Group III nitride semiconductor light-emitting device according to claim 2, wherein a light reflecting film is formed on a light reflecting surface opposite to the light output surface, and wherein the light reflecting film includes a reflectance distribution that a light reflectance is increased in a position where the light intensity is high in the interference pattern appeared on the light reflecting surface.

4. A Group III nitride semiconductor light-emitting device according to claim 2, wherein the light transmittance increases in a direction corresponding to the six-fold rotational symmetry of a light intensity distribution.

5. A Group III nitride semiconductor light-emitting device according to claim 1, wherein a light reflecting film is formed on a light reflecting surface opposite to a light output surface, and wherein the light reflecting film includes a reflectance distribution that a light reflectance is increased in a position where the light intensity is high in the interference pattern appearing on the light reflecting surface.

6. A Group III nitride semiconductor light-emitting device according to claim 5, wherein the light reflectance increases in the light reflecting film in a direction corresponding to the six-fold rotational symmetry of a light intensity distribution.

7. A Group III nitride semiconductor light-emitting device according to claim 1, wherein the period is defined as a distance between two adjacent dents or mesas.

8. A Group III nitride semiconductor light-emitting device according to claim 1, wherein the six-fold rotational symmetry defines a reciprocal lattice of the two-dimensional periodic array.

9. A Group III nitride semiconductor light-emitting device according to claim 1, wherein the light intensity interference pattern includes a light intensity distribution with the six-fold rotational symmetry.

10. A Group III nitride semiconductor light-emitting device according to claim 9, wherein a light transmittance increases in a direction corresponding to the six-fold rotational symmetry of the light intensity distribution.

11. A Group III nitride semiconductor light-emitting device according to claim 9, further comprising a light reflective film in which a light transmittance increases in a direction corresponding to the six-fold rotational symmetry of the light intensity distribution.

12. A Group III nitride semiconductor light-emitting device according to claim 1, wherein a light transmittance increases in a direction corresponding to the six-fold rotational symmetry of the light intensity interference pattern.

* * * * *